United States Patent
Yoshikawa et al.

(10) Patent No.: US 8,753,787 B2
(45) Date of Patent: Jun. 17, 2014

(54) LIGHT PATTERN EXPOSURE METHOD, PHOTOMASK, AND PHOTOMASK BLANK

(71) Applicants: Shin-Etsu Chemical Co., Ltd., Tokyo (JP); Toppan Printing Co., Ltd., Tokyo (JP)

(72) Inventors: Hiroki Yoshikawa, Joetsu (JP); Yukio Inazuki, Joetsu (JP); Ryuji Koitabashi, Joetsu (JP); Hideo Kaneko, Joetsu (JP); Yosuke Kojima, Tokyo (JP); Takashi Haraguchi, Tokyo (JP); Tomohito Hirose, Tokyo (JP)

(73) Assignees: Shin-Etsu Chemical Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 53 days.

(21) Appl. No.: 13/682,228

(22) Filed: Nov. 20, 2012

(65) Prior Publication Data

US 2013/0130160 A1    May 23, 2013

(30) Foreign Application Priority Data

Nov. 21, 2011   (JP) .................................. 2011-253750

(51) Int. Cl.
*G03F 1/68* (2012.01)
*G03F 1/50* (2012.01)

(52) U.S. Cl.
USPC ............................................................. 430/5

(58) Field of Classification Search
USPC ................. 430/5, 322, 328; 428/428, 430
See application file for complete search history.

(56) References Cited

U.S. PATENT DOCUMENTS

| | | | |
|---|---|---|---|
| 5,474,864 A | 12/1995 | Isao et al. | |
| 7,179,545 B2 | 2/2007 | Okazaki et al. | |
| 7,767,366 B2 | 8/2010 | Yoshikawa et al. | |
| 7,771,893 B2 | 8/2010 | Yoshikawa et al. | |
| 7,941,767 B2 | 5/2011 | Mukai et al. | |
| 2010/0167185 A1 | 7/2010 | Suzuki et al. | |
| 2012/0064438 A1* | 3/2012 | Yoshikawa et al. | 430/5 |

FOREIGN PATENT DOCUMENTS

| | | |
|---|---|---|
| DE | 10 2009 060 677 A1 | 8/2010 |
| JP | 4-125642 A | 4/1992 |
| JP | 7-140635 A | 6/1995 |
| JP | 7-181664 A | 7/1995 |
| JP | 10-171096 A | 6/1998 |
| JP | 2004-133029 A | 4/2004 |
| JP | 2007-33469 A | 2/2007 |
| JP | 2007-233179 A | 9/2007 |
| JP | 2007-241065 A | 9/2007 |
| JP | 2008-276002 A | 11/2008 |
| JP | 2010-156880 A | 7/2010 |
| KR | 10-2010-0080413 A | 7/2010 |

OTHER PUBLICATIONS

Faure, T. et al., "Characterization of Binary and Attenuated Phase Shift Mask Blanks for 32nm Mask Fabrication", Proc. of SPIE, 2008, pp. 712209-1 to 712209-12, vol. 7122.

* cited by examiner

*Primary Examiner* — Stephen Rosasco
(74) *Attorney, Agent, or Firm* — Birch, Stewart, Kolasch & Birch, LLP

(57) ABSTRACT

A light pattern exposure method is by irradiating ArF excimer laser light to a resist film through a photomask. The photomask includes a transparent substrate and a pattern of optical film of a material comprising a transition metal, silicon, nitrogen and oxygen, with contents thereof falling in a specific range. The photomask may be irradiated with ArF excimer laser light in a cumulative dose of at least 10 kJ/cm$^2$.

9 Claims, 2 Drawing Sheets

LIGHT PATTERN EXPOSURE METHOD, PHOTOMASK, AND PHOTOMASK BLANK

CROSS-REFERENCE TO RELATED APPLICATION

This non-provisional application claims priority under 35 U.S.C. §119(a) on Patent Application No. 2011-253750 filed in Japan on Nov. 21, 2011, the entire contents of which are hereby incorporated by reference.

TECHNICAL FIELD

This invention relates to a light pattern exposure method using a photomask, as applied in the microfabrication of semiconductor integrated circuits. It also relates to a photomask blank and a photomask prepared from the blank.

BACKGROUND ART

While semiconductor integrated circuits are used in a wide variety of applications, an increasingly finer circuit design is required for such goals as a higher density of integration and a saving of power consumption. In liaison with the demand, the circuit-forming lithography involving exposure through a photomask uses a light source of shorter wavelength in order to produce a finer image. In the advanced lithography process for current use on a commercial basis, the light source for exposure has shifted from KrF excimer laser light (248 nm) to ArF excimer laser light (193 nm).

The lithography using ArF excimer laser light of greater energy was found to cause damages to the mask, which were not found with KrF excimer laser light. One problem is that on continuous use of the photomask, foreign matter-like growth defects form on the photomask. These growth defects are also known as "haze". The source of haze formation was formerly believed to reside in the growth of ammonium sulfate crystals on the mask pattern surface. It is currently believed that organic matter participates in haze formation as well.

Some approaches are known to overcome the haze problem. For example, with respect to the growth defects formed on the photomask upon long-term irradiation of ArF excimer laser light, JP-A 2008-276002 describes that the photomask must be cleaned at a predetermined stage before the photomask can be continuously used. Also JP-A 2010-156880 discloses that haze formation can be inhibited by oxidative treatment of a surface of a photomask blank.

Nevertheless, as the dose of ArF excimer laser light irradiated for pattern transfer increases, the photomask is given damages other than haze. It was found that the line width of the mask pattern changes in accordance with the cumulative irradiation energy dose. See Thomas Faure et al., "Characterization of binary mask and attenuated phase shift mask blanks for 32 nm mask fabrication," Proc. of SPIE vol. 7122, pp 712209-1 to 712209-12. This problem is that as the cumulative irradiation energy dose increases during long-term irradiation of ArF excimer laser light, a layer of a substance which is considered to be an oxide of the pattern material grows outside the film pattern, whereby the pattern width changes. It is reported that the mask once damaged cannot be restored by cleaning with SC-1 (aqueous ammonia/aqueous hydrogen peroxide) as used in the above-mentioned haze removal or with sulfuric acid/aqueous hydrogen peroxide. It is believed that the damage source is utterly different.

The above article points out that upon exposure of a circuit pattern through a halftone phase shift mask which is the mask technology useful in expanding the depth of focus, substantial degradation is induced by pattern size variation resulting from alternation of a transition metal/silicon base material film such as MoSi base material film by irradiation of ArF excimer laser light (this degradation is referred to as "pattern size variation degradation"). Then, in order to use an expensive photomask over a long period of time, it is necessary to address the pattern size variation degradation by irradiation of ArF excimer laser light.

CITATION LIST

Patent Document 1: JP-A 2008-276002 (U.S. Pat. No. 7,941,767)
Patent Document 2: JP-A 2010-156880 (US 20100167185, DE 102009060677, KR 20100080413)
Patent Document 3: JP-A H07-140635
Patent Document 4: JP-A H10-171096
Patent Document 5: JP-A 2004-133029
Patent Document 6: JP-A H07-181664
Patent Document 7: JP-A H04-125642
Patent Document 8: JP-A 2007-033469
Patent Document 9: JP-A 2007-233179
Patent Document 10: JP-A 2007-241065
Non-Patent Document 1: Thomas Faure et al., "Characterization of binary mask and attenuated phase shift mask blanks for 32 nm mask fabrication," Proc. of SPIE vol. 7122, pp 712209-1 to 712209-12

SUMMARY OF INVENTION

Technical Problem

As pointed out in Non-Patent Document 1, the pattern size variation degradation by irradiation of ArF excimer laser light does scarcely occur when light is irradiated in a dry air atmosphere. Exposure in a dry air atmosphere is regarded as a new approach for inhibiting the pattern size variation degradation. However, the control of a dry air atmosphere adds an extra unit to the exposure system and gives rise to electrostatic and other problems to be managed, leading to an increased expense. Under the circumstances, the inventors attempted to improve the film material of a photomask so as to enable long-term exposure in a common atmosphere that does not need complete removal of humidity (typically having a humidity of around 50%).

The photomasks used in the lithography using ArF excimer laser light as light source include halftone phase shift masks which use a transition metal-containing silicon base material, typically a molybdenum-containing silicon base material. This silicon base material is mainly composed of a transition metal and silicon, and further contains oxygen and/or nitrogen as light element (e.g., Patent Document 3), or further contains a minute amount of carbon and/or hydrogen (e.g., Patent Document 4). Suitable transition metals used include Mo, Zr, Ta, W, and Ti. Among others, Mo is most commonly used (e.g., Patent Document 3), and sometimes a second transition metal is added (e.g., Patent Document 5). For the light-shielding film as well, a transition metal-containing silicon base material, typically a molybdenum-containing silicon base material is used.

While the prior art halftone phase shift film uses the aforementioned material to achieve a phase shift of exposure light and a necessary amount of attenuation, it is preferably designed so as to provide the film with a high refractive index by incorporating a certain amount of nitrogen and to acquire optimum optical and chemical properties by adding a necessary amount of oxygen (e.g., Patent Document 6). In particular, the film material adapted for ArF excimer laser light is given the required physical properties by incorporating a larger amount of nitrogen than that for KrF excimer laser light, and optionally, adding a relatively small amount of oxygen. Nevertheless, when a photomask using such a material is irradiated with a large dose of high-energy radiation, the mask undergoes significant pattern size variation degradation by irradiation of high-energy radiation. Then the service lifetime of the photomask is shorter than the requirement.

When a photomask blank is processed into a photomask, sometimes the light-shielding film material is not removed as designed, with such undesired residues becoming defects known as "black defects." Since the photomask is prepared by the time-consuming lithography process, it is desirable that if black defects are formed, the photomask be repaired so that it may be used again.

As the effective technique of removing black defects by local etching of a silicon base material film, Patent Document 7 discloses electron beam defect correction using fluorine. However, many optical films (e.g., halftone phase shift films and light-shielding films) made of transition metal/silicon base materials having a low transition metal content are difficult to correct black defects by such a technique. In the attempt to correct defects on mask pattern by directing a beam of high-energy radiation in a fluorine-containing gas atmosphere to generate fluorine radicals for thereby etching away black defects, often a sufficient etching selectivity ratio is not available between the film and the silicon oxide substrate. Thus the attempt to strip off black defects causes the substrate to be etched at the same time.

An object of the invention is to provide a photomask, a photomask blank therefor, and a light pattern exposure method using the photomask, the photomask having a pattern of optical film which when used in pattern exposure using ArF excimer laser light or analogous light having high energy and short wavelength as compared with the conventional light, and even after a large cumulative dose of irradiation energy, inhibits pattern size variation degradation resulting from film quality alternation of the photomask by irradiating light, and establishes a sufficient selectivity ratio relative to the substrate during the etching step of the electron beam defect correction method using fluorine for correction of black defects.

Solution to Problem

Regarding the transition metal-containing silicon base material (simply referred to as transition metal/silicon base material) used as halftone phase shift film or the like, the inventors made efforts to develop a film material which experiences minimal pattern size variation degradation resulting from quality alternation of the film material even when it is irradiated with ArF excimer laser light in a controlled humid atmosphere as commonly used in the lithography using a photomask, and which allows for the above-described etching step for correction of black defects.

With respect to the instability of transition metal/silicon base material caused by photo-excitation, the inventors formed the following hypothesis. When a transition metal/silicon base material, for example, molybdenum/silicon base material is continuously irradiated with ArF excimer laser light in moist conditions, a nitrogen-containing molybdenum/silicon base material undergoes a chemical change like oxide conversion as a result of nitrogen being liberated. In judging such chemical change susceptibility, the valence of an individual element must be considered. The valence of an element multiplied by its content represents the relative number of bonds of that element in the material. It is believed that the chemical change susceptibility is correlated to the products of elements (product=valence multiplied by content).

Based on the above hypothesis, the inventors made experiments as follows. Photomasks having a film of transition metal/silicon base material were prepared. Many film samples of transition metal/silicon base material containing nitrogen and/or oxygen were formed while varying the contents of transition metal, silicon, nitrogen and oxygen. The film samples were irradiated with ArF excimer laser light in cumulative doses. The photomasks were compared with respect to pattern size variation degradation. It was found that the size variation degradation of the mask pattern by cumulative irradiation of ArF excimer laser light is correlated to the contents of transition metal, silicon, nitrogen and oxygen, and that this correlation is compliant with the above hypothesis. By adjusting the contents of the indicated elements in the optical film of transition metal/silicon base material (e.g., halftone phase shift film or light-shielding film) so as to meet the specific formulae, the pattern size variation degradation by irradiation of ArF excimer laser light is substantially restrained. The film material having such a composition can establish an etching selectivity ratio relative to the substrate. Then the method of correcting defects on mask pattern by directing a beam of high-energy radiation in a fluorine-containing gas atmosphere to generate fluorine radicals for thereby etching away black defects is applicable. The invention is predicated on these findings.

In one aspect, the invention provides a light pattern exposure method comprising irradiating a pattern of light to a resist film through a photomask using ArF excimer laser light as the light source. The photomask used is such that it has been irradiated with ArF excimer laser light in a cumulative dose of at least 10 kJ/cm². The photomask comprises a transparent substrate and a pattern of optical film of a material comprising a transition metal having potentially a valence of 6, silicon, and nitrogen and/or oxygen. The contents of transition metal, silicon, nitrogen and oxygen in the optical film meet both the formulae (1) and (2):

$$6 \times C_M/100 - 4 \times C_{Si}/100 \leq -0.89 \tag{1}$$

$$6C_M \times 3C_N/(6C_M \times 6C_M + 6C_M \times 4C_{Si} + 6C_M \times 3C_N + 6C_M \times 2C_O + 4C_{Si} \times 4C_{Si} + 4C_{Si} \times 3C_N + 4C_{Si} \times 2C_O) \geq 0.094 \tag{2}$$

wherein $C_M$ is a transition metal content in atom %, $C_{Si}$ is a silicon content in atom %, $C_N$ is a nitrogen content in atom % and $C_O$ is an oxygen content in atom %, except for an outermost surface region extending from the film surface remote from the substrate to a depth of 10 nm.

In a preferred embodiment, the photomask has been treated for defect correction by directing a high-energy radiation beam in a fluorine base gas atmosphere.

In another aspect, the invention provides a photomask for use in a light pattern exposure method comprising irradiating a pattern of light to a resist film through the mask using ArF excimer laser light as the light source, the photomask being such that it may be irradiated with ArF excimer laser light in a cumulative dose of at least 10 kJ/cm². The photomask comprises a transparent substrate and a pattern of optical film. The pattern is obtained by forming an optical film of a material comprising a transition metal having potentially a valence of 6, silicon, and nitrogen and/or oxygen on the substrate and patterning the film, wherein the contents of transition metal, silicon, nitrogen and oxygen in the optical film meeting both the formulae (1) and (2):

$$6 \times C_M/100 - 4 \times C_{Si}/100 \leq -0.89 \tag{1}$$

$$6C_M \times 3C_N/(6C_M \times 6C_M + 6C_M \times 4C_{Si} + 6C_M \times 3C_N + 6C_M \times 2C_O + 4C_{Si} \times 4C_{Si} + 4C_{Si} \times 3C_N + 4C_{Si} \times 2C_O) \geq 0.094 \tag{2}$$

wherein $C_M$ is a transition metal content in atom %, $C_{Si}$ is a silicon content in atom %, $C_N$ is a nitrogen content in atom % and $C_O$ is an oxygen content in atom %, except for an outermost surface region extending from the film surface remote from the substrate to a depth of 10 nm.

In a preferred embodiment, the transparent substrate is a silicon oxide substrate, and an etching selectivity ratio of at least 4 is established between the optical film and the silicon oxide substrate.

In a further aspect, the invention provides a photomask blank from which a photomask is prepared, wherein the photomask is used in irradiating a pattern of light to a resist film using ArF excimer laser light as the light source, and the photomask may be irradiated with ArF excimer laser light in a cumulative dose of at least 10 kJ/cm². The photomask blank comprises a transparent substrate and an optical film of a material comprising a transition metal having potentially a valence of 6, silicon, and nitrogen and/or oxygen, wherein the contents of transition metal, silicon, nitrogen and oxygen in the optical film meet both the formulae (1) and (2):

$$6 \times C_M/100 - 4 \times C_{Si}/100 \leq -0.89 \quad (1)$$

$$6C_M \times 3C_N/(6C_M \times 6C_M + 6C_M \times 4C_{Si} + 6C_M \times 3C_N + 6C_M \times 2C_O + 4C_{Si} \times 4C_{Si} + 4C_{Si} \times 3C_N + 4C_{Si} \times 2C_O) \geq 0.094 \quad (2)$$

wherein $C_M$ is a transition metal content in atom %, $C_{Si}$ is a silicon content in atom %, $C_N$ is a nitrogen content in atom % and $C_O$ is an oxygen content in atom %, except for an outermost surface region extending from the film surface remote from the substrate to a depth of 10 nm.

In a preferred embodiment, the transparent substrate is a silicon oxide substrate, and an etching selectivity ratio of at least 4 is established between the optical film and the silicon oxide substrate.

In the foregoing embodiments, the transition metal is typically molybdenum.

Advantageous Effects of Invention

The optical film of transition metal/silicon base material has the advantage that the pattern size variation degradation resulting from quality alternation of the transition metal/silicon base material film (typically MoSi base material film) by cumulative irradiation of ArF excimer laser light is restrained within the permissible range. Even when the cumulative dose of ArF excimer laser light irradiation increases, the light pattern irradiation of photolithography can be performed over a long time without a substantial pattern size variation degradation of light pattern and without changing the pattern exposure conditions of the exposure tool. The optical film not only inhibits pattern size variation degradation by cumulative irradiation, but also establishes a sufficient etching selectivity ratio. Even when black defects are formed on the mask pattern, defect correction can be made by directing a beam of high-energy radiation, typically electron beam in a fluorine-containing gas atmosphere to generate fluorine radicals for thereby etching away black defects.

DESCRIPTION OF EMBODIMENTS

A photomask such as halftone phase shift mask or binary mask for use in the light pattern exposure method of the invention is prepared from a photomask blank comprising a transparent substrate such as quartz substrate and a transition metal/silicon base material film disposed on the substrate, the film being formed of a material comprising a transition metal, silicon, and nitrogen and/or oxygen. The transition metal/silicon base material film may be formed as a halftone phase shift film, light-shielding film or the like.

In one embodiment wherein the transition metal/silicon base material film is a halftone phase shift film, the film should provide a predetermined phase shift (most often, about) 180° and a predetermined transmittance (most often, 1 to 40%) relative to ArF excimer laser light as the exposure light. In another embodiment wherein the transition metal/silicon base material film is a light-shielding film, the film alone should have an optical density of at least 2.0, preferably at least 2.5 if another light-absorbing film is absent. If another light-absorbing film (e.g., halftone phase shift film or etch resistant film) is present, the film is combined with the other light-absorbing film to provide an overall film having an optical density of at least 2.0, preferably at least 2.5.

First, a size variation occurring as the cumulative dose of irradiation energy of ArF excimer laser light increases is discussed. Regarding the mechanism that a size variation is induced in a film of material comprising a transition metal (typically molybdenum), silicon, and nitrogen and/or oxygen by continuously irradiating the film with ArF excimer laser light in the presence of water, the inventors formed the following hypothesis.

(1) When excited by irradiation of ArF excimer laser light, transition metal nitride undergoes chemical reaction to convert into oxide. At this point, the transition metal acts as a nucleus for in-and-out transfer of electric charge due to photo-excitation triggering oxide conversion.

(2) Silicon atom becomes an inhibitory factor against chemical change by irradiation of ArF excimer laser light.

(3) Since the orbit participates in the in-and-out transfer of electric charge, the product of the numbers of bondable bonds of individual elements can be used as an index for the degree of promotion or inhibition of size variation.

It is presumed from this hypothesis that the magnitude of size variation can be evaluated by computing a difference between the indexes of promotion and inhibition of size variation.

Then a variety of material samples containing a transition metal having potentially a valence of 6, silicon and nitrogen and/or oxygen were prepared. A size variation induced upon irradiation of ArF excimer laser light was measured. A relation of material composition and size variation was evaluated. It was found that the value of A:

$$A = 6 \times C_M/100 - 4 \times C_{Si}/100$$

wherein $C_M$ is a transition metal content in atom % and $C_{Si}$ is a silicon content in atom %, as speculated from the material composition, is correlated to the size variation induced when ArF excimer laser light is irradiated under humid conditions in a cumulative dose of at least 10 kJ/cm², and that a material having a lower value of A undergoes a less size variation upon irradiation of ArF excimer laser light.

Nevertheless, many transition metal/silicon base materials having a low value of A establish an insufficient etching selectivity ratio relative to silicon oxide or substrate, which is crucial when the method of directing a beam of high-energy radiation in a fluorine-containing gas atmosphere to generate fluorine radicals for thereby locally etching at the point of beam irradiation is applied as the most preferred black defect correction method. That is, these materials raise a new problem that the correction method is not applicable.

Regarding the relation of etching selectivity ratio and material composition, the inventors then formed the following hypothesis.

(4) In the EB-irradiating defect correction method, fluorine radicals serve as reaction species to form transition metal fluoride and silicon fluoride whereby the transition metal/silicon base material constituting defects is removed. Since reaction to form fluoride is initiated by electron migration, inclusion of a portion susceptible to charge transfer provides a likelihood of reaction.

(5) Since it is believed that transition metal readily changes its valence bond state and is likely to take on or give off electric charge, electron migration from the transition metal participates in silicon reaction.

(6) Since the bond between transition metal and nitrogen serves as a nucleus for in-and-out transfer of electric charge, the progress of reaction largely depends on the number of such bonds.

From the above hypothesis, the following is derived. It is provided that the transition metal is one having potentially a valence of 6 such as molybdenum or tungsten,
(a) is a product of content by valence (=6) of transition metal,
(b) is a product of content by valence (=4) of silicon,
(c) is a product of content by valence (=3) of nitrogen, and
(d) is a product of content by valence (=2) of oxygen, few bonds are formed between light elements, and the total amount of bonds between two elements is the sum of (a)×(a), (a)×(b), (a)×(c), (a)×(d), (b)×(b), (b)×(c), and (b)×(d). It is then recognized that a proportion of the amount of transition metal-nitrogen bonds: (a)×(c) relative to the total amount is used as an index indicative of the progress of reaction.

With a focus on this index, an etching selectivity to ratio was measured, and a relation of material composition to etching selectivity ratio was further evaluated. It was found that the value of B:

$$B = 6C_M \times 3C_N / (6C_M \times 6C_M + 6C_M \times 4C_{Si} + 6C_M \times 3C_N + 6C_M \times 2C_O + 4C_{Si} \times 4C_{Si} + 4C_{Si} \times 3C_N + 4C_{Si} \times 2C_O)$$

wherein $C_M$ is a transition metal content in atom %, $C_{Si}$ is a silicon content in atom %, $C_N$ is a nitrogen content in atom % and $C_O$ is an oxygen content in atom %, as speculated from the material composition, is correlated to the etching selectivity ratio, and that a material having a higher value of B establishes a higher etching selectivity ratio.

It is concluded based on these findings that a silicon base material containing a transition metal having potentially a valence of 6 should have an A value of up to −0.89 (i.e., equal to or more negative than −0.89) and a B value of at least 0.094.

Described below are the photomask used in the light pattern exposure method of the invention and a photomask blank for the photomask.

The photomask blank is defined as comprising a transparent substrate and an optical film of a material comprising a transition metal, silicon, and nitrogen and/or oxygen, sometimes referred to as "transition metal/silicon base material." With respect to the composition of the optical film, the contents of transition metal, silicon, nitrogen and oxygen in the optical film meet both the following formulae (1) and (2) except for an outermost surface region extending from the film surface remote from the substrate to a depth of 10 nm.

$$6 \times C_M / 100 - 4 \times C_{Si} / 100 \leq -0.89 \tag{1}$$

$$6C_M \times 3C_N / (6C_M \times 6C_M + 6C_M \times 4C_{Si} + 6C_M \times 3C_N + 6C_M \times 2C_O + 4C_{Si} \times 4C_{Si} + 4C_{Si} \times 3C_N + 4C_{Si} \times 2C_O) \geq 0.094 \tag{2}$$

Herein $C_M$ is a transition metal content in atom %, $C_{Si}$ is a silicon content in atom %, $C_N$ is a nitrogen content in atom % and $C_O$ is an oxygen content in atom %. The blank is processed into a photomask comprising the transparent substrate and a mask pattern obtained by patterning the optical film.

Although a film of this transition metal/silicon base material undergoes a pattern size variation upon irradiation of ArF excimer laser light, the line width variation is limited to 5 nm or less even after ArF excimer laser light has been irradiated in a cumulative dose of 10 kJ/cm². Also the film establishes an etching selectivity ratio of at least 4 relative to the quartz substrate, allowing the fluorine-assisted EB defect correction method to be applied.

The outermost surface region extending from the film surface disposed remote from the substrate to a depth of 10 nm is excluded in defining the composition of the optical film, because the outermost surface region of the transition metal/silicon base material film has a high degree of oxidation due to atmospheric oxidation or because the film has sometimes been subjected to forced oxidative treatment in order to endow chemical resistance during cleaning or resistance to atmospheric oxidation. There is a possibility that only the outermost surface region of the film is outside the compositional range although the remaining region of the film has a composition conforming to formulae (1) and (2). The surface region having a thickness of the described order has no significant impact on the pattern size variation degradation and the etching selectivity ratio necessary for defect correction.

The optical film of the transition metal/silicon base material having a composition conforming to formulae (1) and (2) except for the outermost surface region undergoes only limited pattern size variation degradation even when it is irradiated with ArF excimer laser light over a long term, or differently stated, even when the cumulative dose of irradiation is increased.

In the process to be employed in the future for light pattern exposure through a photomask, the photomask is required, from the standpoint of economy in the immersion lithography or the like, to satisfy that the size variation of the mask pattern is below the permissible level until the cumulative irradiation energy dose reaches about 10 kJ/cm². For the 22 nm pattern rule, the permissible level is of the order of ±5 nm. On the other hand, when black defects which can be generated upon processing into a photomask are corrected by the fluorine radical etching method, an etching selectivity ratio of at least 4 must be established between the optical film and the silicon oxide substrate in order to carry out the correction without causing damages to the transparent substrate (typically silicon oxide or quartz substrate). If a film of transition metal/silicon base material conforms to formulae (1) and (2) except for the outermost surface region, it can accommodate these requirements.

Suitable optical films include a phase shift film, typically halftone phase shift film, light-shielding film, and antireflective film. In the embodiment wherein the halftone phase shift film is designed for a phase shift of about 180°, the halftone phase shift film as a whole may have an appropriate thickness in the range of 50 to 150 nm, more preferably 60 to 90 nm. When a high light absorptive layer and a low light absorptive layer are combined to construct a structure consisting of uniform composition layers, it is preferred that the high light absorptive layer have a thickness of 1 to 30 nm, especially 5 to 20 nm and the low light absorptive layer have a thickness of 30 to 120 nm, especially 40 to 70 nm. In the case of such multilayer structure, it is preferred for improved chemical resistance that the high light absorptive layer be disposed closer to the transparent substrate. To improve the detection sensitivity to inspection wavelength, this embodiment may also take the form of a three-layer structure in which a low light absorptive layer is sandwiched between two high light absorptive layers, or a four or multilayer structure in which high light absorptive layers and low light absorptive layers are alternately stacked in order on the transparent substrate (either of the layers may be first).

Preferred examples of the material containing transition metal, silicon, and nitrogen and/or oxygen of which the optical film is formed include transition metal/silicon oxynitride, transition metal/silicon oxide nitride carbide, transition metal/silicon nitride, transition metal/silicon oxide, transition metal/silicon carbide nitride, and transition metal/silicon carbide oxide.

The transition metal having potentially a valence of 6 (meaning that the transition metal can have a valence of 6) is typically at least one element selected from molybdenum and tungsten. Of these, molybdenum is most preferred from the standpoint of dry etching. The content of transition metal is discussed first. If the transition metal content is high, the contents of other elements are relatively low, making it difficult to adjust the compositional ratio of respective elements so as to meet the required optical properties including refractive index and transmittance and formulae (1) and (2). Then in the transition metal/silicon base material film except for the outermost surface region, the transition metal content is preferably at least 5 atom %, more preferably at least 6 atom %, and up to 12 atom %, more preferably up to 10 atom %. Also in the transition metal/silicon base material film except for the outermost surface region, the silicon content is preferably at least 30 atom %, more preferably at least 35 atom %, and up to 50 atom %, more preferably up to 45 atom %.

In the transition metal/silicon base material film except for the outermost surface region, the oxygen content should preferably be up to 20 atom %. Too high an oxygen content may lead to too low an etching selectivity ratio relative to the substrate to apply the high-energy beam defect correction method using fluorine base gas. Also the oxygen content should preferably be at least 3 atom %, more preferably at least 5 atom %. At too low an oxygen content, the content of nitrogen or transition metal must be increased to acquire necessary optical properties, and as a result, the pattern size variation degradation after long-term irradiation of ArF excimer laser light is increased.

In the transition metal/silicon base material film except for the outermost surface region, the nitrogen content should preferably be at least 25 atom %, more preferably at least 30 atom %. The range ensures a necessary refractive index and transmittance when the oxygen content is within the specific range. Also the nitrogen content should preferably be up to 50 atom %. At too high a nitrogen content, the pattern size variation degradation after long-term irradiation of ArF excimer laser light may be increased.

The transition metal/silicon base material film may further contain carbon, hydrogen and rare-gas elements in low contents. The content of such an element is preferably up to 5 atom % and more preferably carbon should not exceed the impurity level.

The transition metal/silicon base material film may be deposited by well-known techniques. Among others, the sputtering technique is preferred because a film featuring homogeneity is readily deposited. The sputtering technique may be either DC sputtering or RF sputtering.

A choice of target and sputtering gas depends on the layer construction and composition. The target may be a single target in which a ratio of transition metal to silicon is adjusted appropriate or a combination of targets selected from a transition metal target, a silicon target, and a transition metal/silicon target. Where plural targets are used, the ratio of transition metal to silicon may be controlled by adjusting the sputtering area of an individual target or by adjusting the power applied to an individual target. Particularly when a multilayer structure is constructed by combining a high light absorptive layer with a low light absorptive layer, the content of transition metal in the high light absorptive layer and the low light absorptive layer may be independently changed by the above-described method. If the low light absorptive layer has a low transition metal content, then the contents of the remaining elements may be readily set so as to meet the desired optical properties.

The nitrogen and/or oxygen content may be adjusted by effecting reactive sputtering using nitrogen-containing gas and/or oxygen-containing gas as the reactive sputtering gas while adjusting the flow rates of these gases. This is true when other light elements such as carbon and hydrogen are added. Examples of the reactive gas used herein include nitrogen gas, oxygen gas, nitrogen oxide gas, carbon oxide gas, hydrocarbon gas, hydrogen gas, and the like. In addition, a rare gas such as helium, neon or argon gas may be used.

As mentioned above, the optical film at its outermost surface may be provided with a surface oxidized layer for the purpose of stabilizing the film. The means for forming the surface oxidized layer include air oxidation or atmospheric oxidation and forced oxidative treatment. The forced oxidative treatment of a transition metal/silicon base material film may be performed, for example, by treating with ozone gas or ozone water, or by heating at a temperature of about 300° C. such as oven heating in an oxygen-containing atmosphere, lamp annealing, and laser heating. The surface oxidized layer has a thickness of up to 10 nm, and a thickness of at least 1 nm is sufficient to be effective as an oxide layer. The surface oxidized layer having a thickness of this order has no substantial impact on the pattern size variation degradation by irradiation of ArF excimer laser light. Although the surface oxidized layer may be formed by increasing the flow rate of oxygen during the sputtering process, it is preferably formed by the above-mentioned air oxidation or forced oxidative treatment after the optical film has been deposited to the desired composition conforming to formulae (1) and (2) because the layer formed thereby contains less defects.

In the case of a halftone phase shift mask blank from which a halftone phase shift mask for use in the exposure method of the invention is prepared, like conventional halftone phase shift mask blanks, a light-shielding film may be formed on the halftone phase shift film in order to provide a full light shielding region thereon. Although the light-shielding film may be made of any desired materials, a film of chromium base material which can be also utilized as an auxiliary film for etching process is preferred. With respect to the construction and composition of the light-shielding film, a number of reports are known, for example, from Patent Documents 8 and 9. Preferably the light-shielding film is constructed by forming a Cr base light-shielding film, and further depositing thereon a Cr base antireflective film for reducing reflection from the light-shielding film. The light-shielding film and antireflective film each may be a single layer or a multilayer structure. The materials for the Cr base light-shielding film and antireflective film include chromium alone, chromium oxide (CrO), chromium nitride (CrN), chromium carbide (CrC), chromium oxynitride (CrON), chromium oxycarbide (CrOC), chromium nitride carbide (CrNC), and chromium oxide nitride carbide (CrONC).

The Cr base light-shielding film and antireflective film may be deposited by reactive sputtering. The reactive sputtering process uses a target of chromium alone or a target of chromium having one or more of oxygen, nitrogen and carbon added thereto. The sputtering gas is an inert gas such as Ar, He, Ne or Kr, to which a gas selected from oxygen-containing gas, nitrogen-containing gas and carbon-containing gas in accordance with the desired composition of a film being deposited is added.

In another version of the embodiment wherein a light-shielding film is provided, an auxiliary film or etch stop film of chromium base material as disclosed in Patent Document 10 may be formed on the halftone phase shift film, and a light-shielding film of a transition metal/silicon base compound be formed thereon.

The photomask blank may be processed into a photomask by a standard technique. For example, a halftone phase shift mask blank comprising a halftone phase shift film and a light-shielding film or antireflective film of chromium base material deposited thereon may be processed as follows.

First, a resist film adapted for electron beam (EB) lithography is formed on the halftone phase shift mask blank, exposed to a pattern of EB, and developed in a conventional way, forming a resist pattern. While the resist pattern thus obtained is used as etching mask, oxygen-containing chlorine base dry etching is carried out for transferring the resist pattern to the chromium base material film. While the chromium base material film pattern is used as etching mask, fluorine base dry etching is carried out for transferring the pattern to the halftone phase shift film. If any region of the chromium base material film is to be left as a light-shielding film, a resist pattern for protecting that region is formed. Thereafter, the unnecessary chromium base material film is stripped off by oxygen-containing chlorine base dry etching again. The resist material is removed in a conventional manner, yielding a halftone phase shift mask.

Where black defects are formed on the photomask, the defect correction method of directing a beam of high-energy radiation in the presence of fluorine-containing gas to generate fluorine radicals for etching is applicable as long as the photomask is prepared from the photomask blank according to the invention. As the etching method, the EB defect correction method using fluorine is advantageous.

The fluorine-assisted EB defect correction method used herein is disclosed in JP-A H04-125642 (Patent Document 7) wherein a film which can be etched with fluorine base gas is subjected to local fluorine base dry etching for correcting defects. In this method, a fluorine-containing gas such as $XeF_2$ gas is supplied to a photomask to be repaired, whereby the fluorine-containing gas molecule is adsorbed to the surface of the film to be corrected. An electron beam (EB) is then directed to a point of correction to be etched whereupon fluorine is liberated from the fluorine-containing gas molecule adsorbed. The thus liberated fluorine reacts at the point of correction to form transition metal fluoride and silicon fluoride whereupon these products volatilize off, that is, defects are etched away.

The fluorine-containing gas may be any of well-known gases for fluorine-base dry etching, including carbon fluorides and fluorinated hydrocarbons such as $CF_4$, $CHF_3$ and $C_2F_6$, $XeF_2$ and the like. These gases may be used alone or in admixture and further in combination with oxygen gas. Adsorption of etchant gas may be carried out, for example, by placing a photomask to be repaired in a vacuum chamber and injecting a suitable flow rate of a gas to the film to be corrected over a predetermined time. The photomask is preferably cooled so that more fluorine-containing gas may be adsorbed. Etching conditions generally include a chamber pressure of up to 0.13 Pa, an assist gas line pressure of 50 to 3,000 Pa, and a beam accelerating voltage of 0.5 to 20 keV. As the system for carrying the correction method into practice, an E-beam based mask repair system MeRiT® from Carl Zeiss is most advantageously used.

The light pattern exposure method of the invention is by preparing a photomask from the photomask blank and projecting ArF excimer laser light to the pattern of transition metal/silicon material film on the photomask to irradiate ArF excimer laser light to an object (resist film) through the photomask for thereby exposing the object to the mask pattern of light. The irradiation of ArF excimer laser light may be either dry lithography or immersion lithography. The invention is useful particularly when a wafer of at least 300 mm as a work to be processed is exposed to a pattern of light by the immersion lithography with the tendency that a cumulative irradiation energy dose increases within a relatively short time in commercial scale microfabrication.

It is a serious problem that when a mask pattern of a transition metal/silicon base material film is irradiated with ArF excimer laser light, the mask pattern experiences a variation of line width. The permissible threshold of pattern width differs with the mask pattern, especially the pattern rule applied thereto. If variations are small, the photomask may be further used by correcting the conditions and resetting the irradiation conditions of an exposure system. When the photomask of the invention is used, the pattern size variation degradation by irradiation of light is substantially nil as long as the cumulative irradiation energy dose is less than 10 $kJ/cm^2$. Even when the cumulative irradiation energy dose exceeds 10 $kJ/cm^2$, the pattern size variation degradation by irradiation of light is minimal, allowing the light pattern exposure to be continued without resetting the transfer conditions.

EXAMPLES

Experiments are given below for further illustrating the invention although the invention is not limited thereto.

Experiments 1 to 9

A DC sputtering system was loaded with two targets, a $MoSi_2$ target and a Si target, and Ar gas, $O_2$ gas and $N_2$ gas were fed thereto as sputtering gas. While a quartz substrate was spun at 30 rpm, a single layer consisting of molybdenum, silicon, nitrogen, and optional oxygen was deposited on the substrate to form a transition metal/silicon base material film (molybdenum/silicon base material film) of about 70 nm thick as a halftone phase shift film. The composition of these 9 transition metal/silicon base material films except for a sub-surface region that extended from the film surface to a depth of 10 nm was analyzed by ESCA.

Next, on the transition metal/silicon base material film, a light-shielding film of chromium base material was deposited using a Cr target and sputtering gases. Specifically, a CrON layer of 20 nm thick was deposited by feeding Ar, $N_2$ and $O_2$ gases in a flow rate ratio of $Ar:N_2:O_2=1:2:1$, a Cr layer of 7 nm thick was deposited by feeding only Ar gas, and a CrON layer of 20 nm thick was deposited by feeding Ar, $N_2$ and $O_2$ gases in a flow rate ratio of $Ar:N_2:O_2=1:2:1$. In this way, a light-shielding film of chromium base material having a total thickness of 47 nm was formed, yielding a photomask blank (halftone phase shift mask blank).

Next, a positive resist film for EB lithography was formed on the light-shielding film. The resist film was exposed to a pattern of EB, forming an iso-line, iso-space, line-and-space model pattern having a line width of 0.1 to 2 μm.

With the resist pattern made etching mask, the light-shielding film was dry etched with chlorine base etchant. Then the transition metal/silicon base material film was dry etched with fluorine base etchant. Finally the light-shielding film was removed by chlorine base dry etching, yielding a photomask (halftone phase shift mask) having a pattern of the transition metal/silicon base material film.

In an environment of 23° C. and humidity 40%, the photomask thus obtained was irradiated with ArF excimer laser light having a pulse width of 200 Hz and a pulse energy of 50 to 200 mJ until the cumulative irradiation energy dose reached 30 kJ/cm². An exposure system ArFES-3500PM (Litho Tech Japan Corp.) and a light source LPX Pro220 (Coherent GmbH) were used.

The size of the pattern of transition metal/silicon base material film was measured under a scanning electron microscope LWM9045 (Vistec) to determine how the pattern size varied when the pattern was irradiated with ArF excimer laser light. It was observed that the line width increased at a rate proportional to time independent of the type and size of the pattern.

For patterns of different type and line width, changes (increases) of line width were averaged. The average was expressed in a relative value provided that the average change (19 nm) of Experiment 3 is 1. Also a change corresponding to a cumulative irradiation dose of 10 kJ/cm² was computed from the measured change. The line width change data are shown in Table 1 together with the contents of respective elements on analysis of the film as deposited, and plotted in FIG. 1 as a function of A value corresponding to the left side of formula (1), that is, $6 \times C_M/100 - 4 \times C_{Si}/100$ (value of formula (1) on the abscissa of FIG. 1).

Experiments 10 to 21

A DC sputtering system was loaded with two targets, a $MoSi_2$ target and a Si target, and Ar gas, $O_2$ gas and $N_2$ gas were fed thereto as sputtering gas. While a quartz substrate was spun at 30 rpm, a single layer consisting of molybdenum, silicon, nitrogen, and optional oxygen was deposited on the substrate to form a transition metal/silicon base material film (molybdenum/silicon base material film) of about 70 nm thick as a halftone phase shift film. The composition of these 12 transition metal/silicon base material films except for a sub-surface region that extended from the surface to a depth of 10 nm was analyzed by ESCA.

Using an EB-based mask repair system MeRiT® (Carl Zeiss), the transition metal/silicon base material film thus deposited was etched by placing it in a chamber pumped to a vacuum of 0.13 Pa or below, and injecting xenon fluoride gas as the etching-assist gas to near the point of correction. The etching rate of fluorine-assisted EB defect correction method was determined. By comparing it with the etching rate of quartz substrate, an etching selectivity ratio was determined.

The etching selectivity ratio is shown in Table 2 together with the contents of respective elements on analysis of the film as deposited. The processing rates (relative values) corresponding to etching selectivity ratios are plotted in FIG. 2 as a function of B value corresponding to the left side of formula (2), that is, $6C_M \times 3C_M/(6C_M \times 6C_M + 6C_M 4C_{Si} + 6C_M \times 3C_N + 6C_M \times 2C_O + 4C_{Si} \times 4C_{Si} + 4C_{Si} \times 3C_N + 4C_{Si} \times 2C_O)$ (value of formula (2) on the abscissa of FIG. 2).

TABLE 1

| | | Content (at %) | | | | Value of formula (1) | Line width change (relative | Line width change (nm) corresponding to cumulative dose of |
|---|---|---|---|---|---|---|---|---|
| | | Mo | Si | N | O | (A value) | value) | 10 kJ/cm² |
| Experiment | 1 | 7.8 | 37.9 | 44.2 | 10.1 | −1.048 | 0.60 | 3.8 |
| | 2 | 7.8 | 37.4 | 41.7 | 13.1 | −1.028 | 0.55 | 3.5 |
| | 3 | 10.6 | 37.4 | 39.8 | 12.2 | −0.860 | 1.00 | 6.3 |
| | 4 | 6.6 | 45.5 | 39.3 | 8.6 | −1.424 | 0.32 | 2.0 |
| | 5 | 5.1 | 43.2 | 38.5 | 13.2 | −1.422 | 0.32 | 2.0 |
| | 6 | 4.3 | 40.2 | 42.2 | 13.3 | −1.350 | 0.29 | 1.8 |
| | 7 | 3.8 | 47.3 | 40.8 | 8.1 | −1.664 | 0.14 | 0.9 |
| | 8 | 9.0 | 46.5 | 39.8 | 4.7 | −1.320 | 0.32 | 2.0 |
| | 9 | 9.7 | 34.0 | 42.2 | 14.1 | −0.778 | 0.85 | 5.4 |

Figure 1:
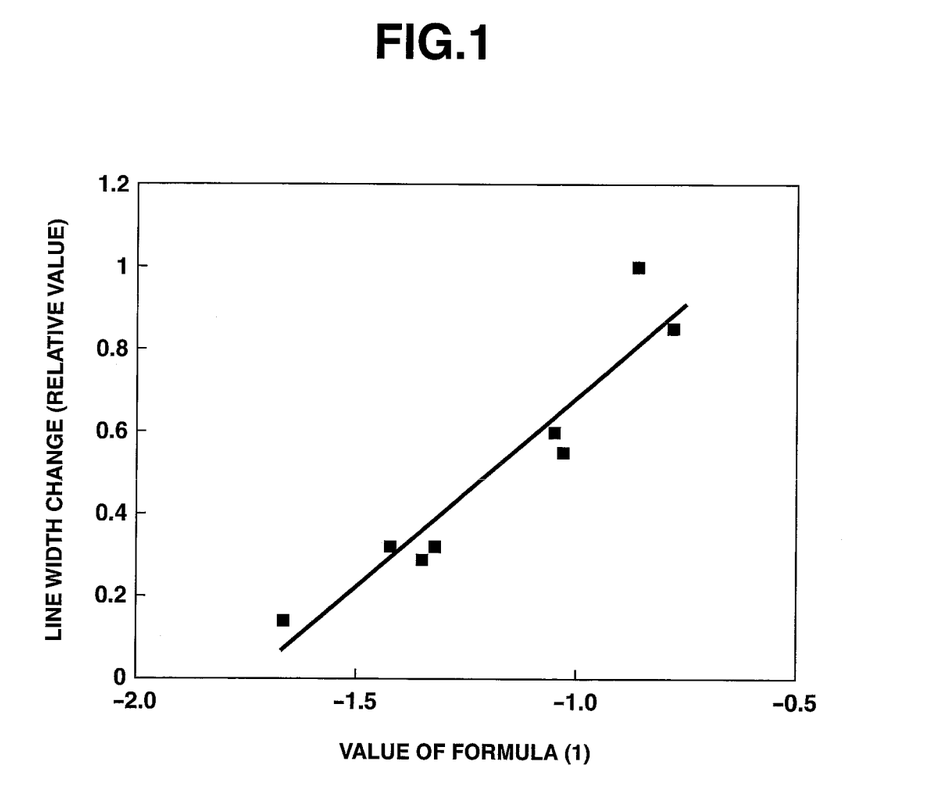
FIG. 1 is a diagram showing line width variation versus value of formula (1) (A value) in Experiments, with a regression line.

On regression analysis by the least square method using nine (9) points depicted in FIG. 1, the following correlation formula was obtained with a correlation coefficient $R^2$ being 0.90. The regression line is also depicted in FIG. 1.

Line width change(relative value)=0.92×A+1.60

It is evident from this correlation formula that the A value giving a line width change within the permissible range of 5 nm when ArF excimer laser light is irradiated in a cumulative dose of 10 kJ/cm² is up to −0.89. Thus as long as the silicon base material containing a transition metal having potentially a valence of 6 meets formula (1), a film thereof is fully restrained in pattern size variation due to irradiation of ArF excimer laser light, and the line width change is restricted to 5 nm or less even after irradiation in a cumulative dose of 10 kJ/cm².

TABLE 2

| | | Content (at %) | | | | Value of formula (2) | Etching selectivity ratio |
|---|---|---|---|---|---|---|---|
| | | Mo | Si | N | O | (B value) | (to $SiO_2$) |
| Experiment | 10 | 7.8 | 37.9 | 44.2 | 10.1 | 0.099 | 4.7 |
| | 11 | 7.8 | 37.4 | 41.7 | 13.1 | 0.096 | 4.5 |
| | 12 | 10.6 | 37.4 | 39.8 | 12.2 | 0.114 | 8.0 |
| | 13 | 9.0 | 46.5 | 39.8 | 4.7 | 0.082 | 2.0 |
| | 14 | 9.7 | 34.0 | 42.2 | 14.1 | 0.123 | 9.2 |
| | 15 | 4.1 | 43.4 | 43.9 | 8.6 | 0.050 | 1.0 |
| | 16 | 9.6 | 34.7 | 29.4 | 26.3 | 0.087 | 3.5 |
| | 17 | 9.1 | 32.6 | 27.7 | 30.6 | 0.084 | 3.3 |
| | 18 | 8.8 | 33.4 | 32.7 | 25.1 | 0.094 | 4.2 |

TABLE 2-continued

| | Content (at %) | | | | Value of formula (2) | Etching selectivity ratio |
|---|---|---|---|---|---|---|
| | Mo | Si | N | O | (B value) | (to SiO$_2$) |
| 19 | 9.6 | 33.2 | 38.1 | 19.1 | 0.114 | 10.2 |
| 20 | 8.7 | 36.3 | 47.3 | 7.7 | 0.119 | 7.9 |
| 21 | 8.7 | 35.3 | 41.7 | 14.3 | 0.109 | 8.0 |

Figure 2:
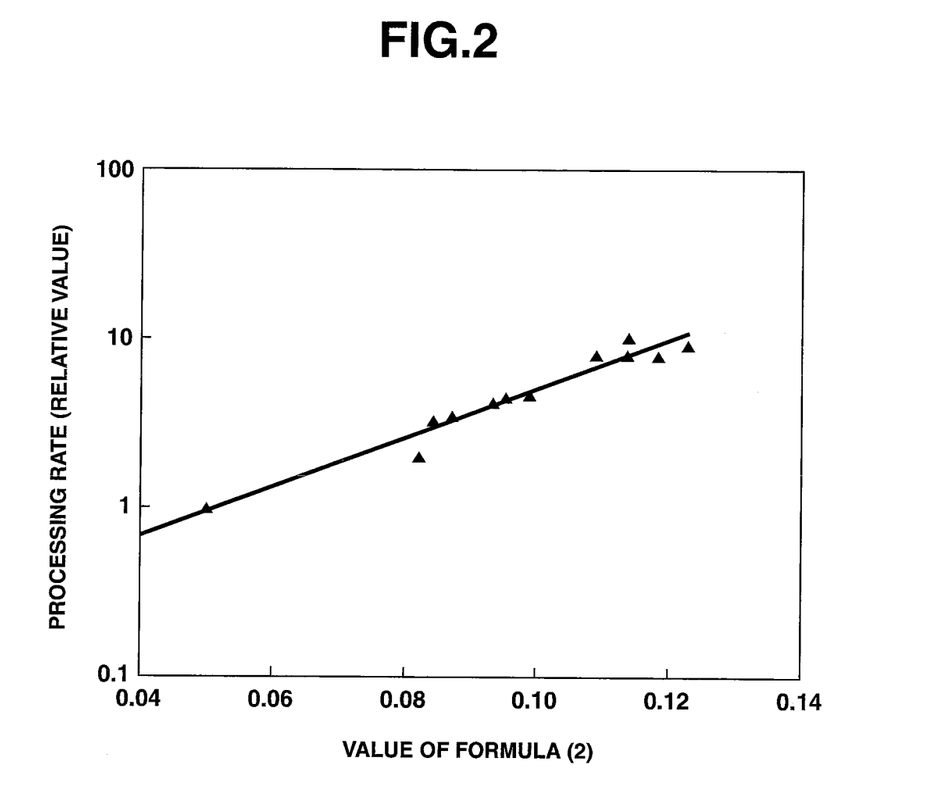
FIG. 2 is a diagram showing processing rate versus value of formula (2) (B value) in Experiments, with a regression line.

On regression analysis by the least square method using twelve (12) points depicted in FIG. 2, the following correlation formula was obtained with a correlation coefficient R$^2$ being 0.95. The regression line is also depicted in FIG. 2.

$$\log(\text{Etching selectivity ratio}) = 33.0 \times B - 1.69$$

It is evident from this correlation formula that the B value giving an etching selectivity ratio of at least 4 relative to quartz substrate that allows for application of the method of correcting defects on mask pattern by directing a beam of high-energy radiation in a fluorine-containing gas atmosphere to generate fluorine radicals for etching away black defects is at least 0.094. Then as long as the silicon base material containing a transition metal having potentially a valence of 6 meets formula (2), a film thereof establishes an etching selectivity ratio of at least 4 relative to quartz substrate and allows for application of the fluorine-assisted EB defect correction method.

Japanese Patent Application No. 2011-253750 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A light pattern exposure method comprising irradiating a pattern of light to a resist film through a photomask using ArF excimer laser light as the light source, wherein
the photomask used is such that it has been irradiated with ArF excimer laser light in a cumulative dose of at least 10 kJ/cm$^2$,
said photomask comprising a transparent substrate and a pattern of optical film of a material comprising a transition metal, silicon, and nitrogen and/or oxygen, the transition metal having potentially a valence of 6,
the contents of transition metal, silicon, nitrogen and oxygen in the optical film meeting both the formulae (1) and (2):

$$6 \times C_M/100 - 4 \times C_{Si}/100 \le -0.89 \quad (1)$$

$$6C_M \times 3C_N/(6C_M \times 6C_M + 6C_M \times 4C_{Si} + 6C_M \times 3C_N + 6C_M \times 2C_O + 4C_{Si} \times 4C_{Si} + 4C_{Si} \times 3C_N + 4C_{Si} \times 2C_O) \ge 0.094 \quad (2)$$

wherein $C_M$ is a transition metal content in atom %, $C_{Si}$ is a silicon content in atom %, $C_N$ is a nitrogen content in atom % and $C_O$ is an oxygen content in atom %, except for an outermost surface region extending from the film surface remote from the substrate to a depth of 10 nm.

2. The method of claim 1 wherein the photomask has been treated for defect correction by directing a high-energy radiation beam in a fluorine base gas atmosphere.

3. The method of claim 1 wherein the transition metal is molybdenum.

4. A photomask for use in a light pattern exposure method comprising irradiating a pattern of light to a resist film through the mask using ArF excimer laser light as the light source, said photomask being such that it may be irradiated with ArF excimer laser light in a cumulative dose of at least 10 kJ/cm$^2$,
said photomask comprising a transparent substrate and a pattern of optical film, the pattern being obtained by forming an optical film of a material comprising a transition metal, silicon, and nitrogen and/or oxygen on the substrate and patterning the film, the transition metal having potentially a valence of 6,
the contents of transition metal, silicon, nitrogen and oxygen in the optical film meeting both the formulae (1) and (2):

$$6 \times C_M/100 - 4 \times C_{Si}/100 \le -0.89 \quad (1)$$

$$6C_M \times 3C_N/(6C_M \times 6C_M + 6C_M \times 4C_{Si} + 6C_M \times 3C_N + 6C_M \times 2C_O + 4C_{Si} \times 4C_{Si} + 4C_{Si} \times 3C_N + 4C_{Si} \times 2C_O) \ge 0.094 \quad (2)$$

wherein $C_M$ is a transition metal content in atom %, $C_{Si}$ is a silicon content in atom %, $C_N$ is a nitrogen content in atom % and $C_O$ is an oxygen content in atom %, except for an outermost surface region extending from the film surface remote from the substrate to a depth of 10 nm.

5. The photomask of claim 4 wherein the transition metal is molybdenum.

6. The photomask of claim 4 wherein the transparent substrate is a silicon oxide substrate, and an etching selectivity ratio of at least 4 is established between the optical film and the silicon oxide substrate.

7. A photomask blank from which a photomask is prepared, wherein the photomask is used in irradiating a pattern of light to a resist film using ArF excimer laser light as the light source, and the photomask may be irradiated with ArF excimer laser light in a cumulative dose of at least 10 kJ/cm$^2$,
said photomask blank comprising a transparent substrate and an optical film of a material comprising a transition metal, silicon, and nitrogen and/or oxygen, the transition metal having potentially a valence of 6,
the contents of transition metal, silicon, nitrogen and oxygen in the optical film meeting both the formulae (1) and (2):

$$6 \times C_M/100 - 4 \times C_{Si}/100 \le -0.89 \quad (1)$$

$$6C_M \times 3C_N/(6C_M \times 6C_M + 6C_M \times 4C_{Si} + 6C_M \times 3C_N + 6C_M \times 2C_O + 4C_{Si} \times 4C_{Si} + 4C_{Si} \times 3C_N + 4C_{Si} \times 2C_O) \ge 0.094 \quad (2)$$

wherein $C_M$ is a transition metal content in atom %, $C_{Si}$ is a silicon content in atom %, $C_N$ is a nitrogen content in atom % and $C_O$ is an oxygen content in atom %, except for an outermost surface region extending from the film surface remote from the substrate to a depth of 10 nm.

8. The blank of claim 7 wherein the transition metal is molybdenum.

9. The blank of claim 7 wherein the transparent substrate is a silicon oxide substrate, and an etching selectivity ratio of at least 4 is established between the optical film and the silicon oxide substrate.

* * * * *